United States Patent
Arigane et al.

(10) Patent No.: US 6,927,443 B2
(45) Date of Patent: Aug. 9, 2005

(54) NONVOLATILE SEMICONDUCTOR MEMORY DEVICE

(75) Inventors: Tsuyoshi Arigane, Tachikawa (JP); Takashi Kobayashi, Tokorozawa (JP); Yoshitaka Sasago, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/682,479

(22) Filed: Oct. 10, 2003

(65) Prior Publication Data

US 2004/0076072 A1 Apr. 22, 2004

(30) Foreign Application Priority Data

Oct. 15, 2002 (JP) .................................... P2002-300163

(51) Int. Cl.[7] ........................ H01L 25/108; G11C 16/04
(52) U.S. Cl. ................... 257/300; 257/298; 365/185.12
(58) Field of Search ............................. 257/295, 300; 438/3; 365/185.12, 171, 226, 185.28

(56) References Cited

U.S. PATENT DOCUMENTS

| | | | | |
|---|---|---|---|---|
| 5,838,615 | A | * 11/1998 | Kamiya et al. | 365/185.12 |
| 6,043,526 | A | * 3/2000 | Ochiai | 257/295 |
| 6,504,763 | B1 | * 1/2003 | Yang et al. | 365/185.28 |
| 6,570,203 | B2 | * 5/2003 | Hikosaka et al. | 257/295 |
| 6,706,540 | B2 | * 3/2004 | Hikosaka et al. | 438/3 |
| 6,731,535 | B1 | * 5/2004 | Ooishi et al. | 365/171 |
| 6,765,840 | B2 | * 7/2004 | Sato et al. | 365/226 |

FOREIGN PATENT DOCUMENTS

| | | |
|---|---|---|
| JP | 02-074069 | 3/1990 |
| JP | 08-046159 | 2/1996 |

* cited by examiner

*Primary Examiner*—Howard Weiss
*Assistant Examiner*—Hoa (Vikki) B. Trinh
(74) *Attorney, Agent, or Firm*—Miles & Stockbridge P.C.

(57) ABSTRACT

A nonvolatile semiconductor memory device improved with integration degree, in which the gate of the selection transistors is separated on each of active regions, first and second selection transistors are arranged in two stages in the direction of the global bit line, the gates for the selection transistors in each stage are disposed on every other active regions, contact holes are formed in mirror asymmetry with respect to line B—B in the connection portion for the active regions, the gate is connected through the contact hole to the wiring, the adjacent active regions are connected entirely in one selection transistor portion and connected in an H-shape for adjacent two active regions in another selection transistor portion, and the contact hole is formed in the connection portion and connected when the global bit line, whereby the pitch for the selection transistor portion can be decreased in the direction of the global bit line.

17 Claims, 17 Drawing Sheets

NONVOLATILE SEMICONDUCTOR MEMORY DEVICE

BACKGROUND OF THE INVENTION

1. Field of the Invention

The present invention relates to a nonvolatile semiconductor memory device and more particularly to a structure of a memory cell array suitable to higher integration of a nonvolatile semiconductor memory device capable of electric rewriting.

2. Description of Related Art

Since a flash memory as one of nonvolatile semiconductor memory devices is excellent in portability, impact resistance and capable of electrically erasing collectively, a demand therefor has been increased rapidly in recent years as a memory device for small-sized portable information equipments such as portable personal computers or portable telephones.

In the flash memory, lowering of the bit cost is an important subject and, for attaining this, there has been proposed a method of decreasing the number of contact holes and global bit lines thereby decreasing the chip area by improving the layout not only for the memory cells but also for selection transistors.

In the existent NAND type flash memory, two active regions are connected, and are connected by way of contact holes to global bit lines, and first selection transistors for selecting two memory cell strings disposed in each of the active regions are arranged in two rows with gate wirings thereof being in parallel. The selection transistors in each row are constituted by serially connecting enhancement type transistors and depletion type transistors alternately. Further, the source line is disposed in perpendicular to the active region, second selection transistors are disposed in one row so as to be connected with the source line, and a plurality of memory cell transistors each having a first gate and a second gate are connected in series between the first selection transistors in two rows and the second selection transistors in one row (for example, refer to Patent Document 1 infra).

Alternatively, there is a method of constituting selection transistors only with enhancement type transistors by separately disposing the first selection transistors and the second selection transistors, thereby saving ion implantation for forming depletion type transistors and thereby simplifying the production steps (for example, refer to Patent Document 2 infra).

In the two examples of the Patent Document 1 and the Patent Document 2 described above, two rows of selection transistors and two contact holes necessary for connection of two rows of the active regions with a common global bit line are simplified into selection transistors in two rows and one contact hole, thereby decreasing the area in the direction of bit line and reducing the chip area.

[Patent Document 1]

JP-A No. 74069/1990

[Patent Document 2 ]

JP-A No. 46159/1996

However, in the two patent documents described above, a method of decreasing the area for the selection transistor portion per se is not disclosed.

SUMMARY OF THE INVENTION

The present invention intends to provide a nonvolatile semiconductor memory device improved with the integration degree by layout constitution of reducing the area for the selection transistor portion.

The nonvolatile semiconductor memory device according to the invention adopts the following constitution for solving the problem. That is, the nonvolatile semiconductor memory device has a memory cell array constituted by arranging plural nonvolatile memory cells in a matrix, in which first and second active regions adjacent to each other with a device isolation region of the memory cell array put therebetween connected by way of contact holes with global bit lines, and has first and second selection transistors for selecting the first and second active regions, wherein the gates for the first and second selection transistors are separated and disposed each by one on the first and second active regions respectively.

In the nonvolatile semiconductor memory device, the separated gates of the first and second selection transistors are arranged in two stages in the direction of the global bit lines.

In this case, the gate for the selection transistor in each of the stages is preferably disposed on every other active region.

Further, the contact hole is preferably formed about at the intersection between one of the first and second active regions and the connection portion, and the gate of the selection transistor of the first and second selection transistors that is disposed on the side of the memory cell is disposed on the active region in which the contact hole is formed.

Further, the gate of the first and second selection transistors is preferably separated and disposed being further extended from the first active region to the third active region adjacent with the second active region.

Further, the gates of the selection transistors and the memory blocks are preferably disposed in mirror symmetry with respect to a plane perpendicular to the global bit line and passing through the connection portion for the active regions.

Further, the memory block may be disposed in mirror symmetry with respect to a plane perpendicular to the global bit line and passing through the connection portion for the active regions.

In the nonvolatile semiconductor memory device, the memory cells are connected in series to the global bit line.

In the nonvolatile semiconductor memory device, the memory cells are connected in parallel to the global bit line.

In the nonvolatile semiconductor memory device, the nonvolatile memory cell has a first gate, a second gate and a third gate having a function different from the first gate and the second gate.

In another aspect of the present invention a nonvolatile semiconductor memory device comprises a memory cell array constituted by arranging, in a matrix, nonvolatile memory cells each having a first gate, a second gate, and a third gate different in the function from the first gate and the second gate, in which two active regions adjacent to each other with the device isolation region of the memory cells put therebetween are combined in one set, and respective active regions are connected by way of contact holes to a global bit line in common, and having first and second selection transistors for selecting the active regions.

BRIEF DESCRIPTION OF THE DRAWINGS

Preferred embodiments of present invention will be described in details based on the drawings, wherein.

DETAILED DESCRIPTION OF THE PREFERRED EMBODIMENTS

The present invention is to be described in details by way of preferred embodiments of a nonvolatile semiconductor memory device according to the present invention with reference to the accompanying drawings.

Embidoment 1

Figure 1:
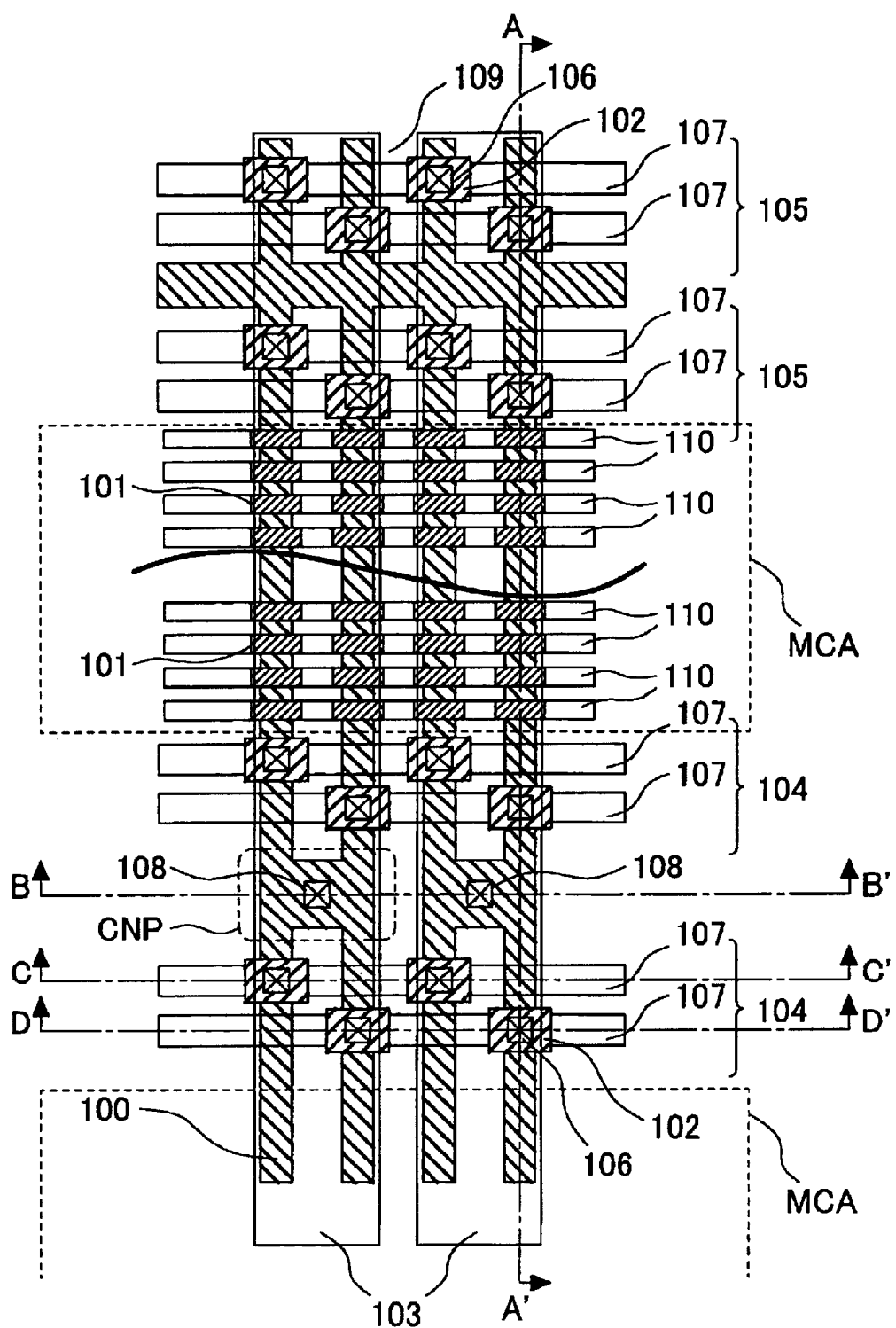
FIG. 1 is a plan view showing an example of a layout for a first embodiment of a nonvolatile semiconductor memory device according to the invention.
Figure 6:
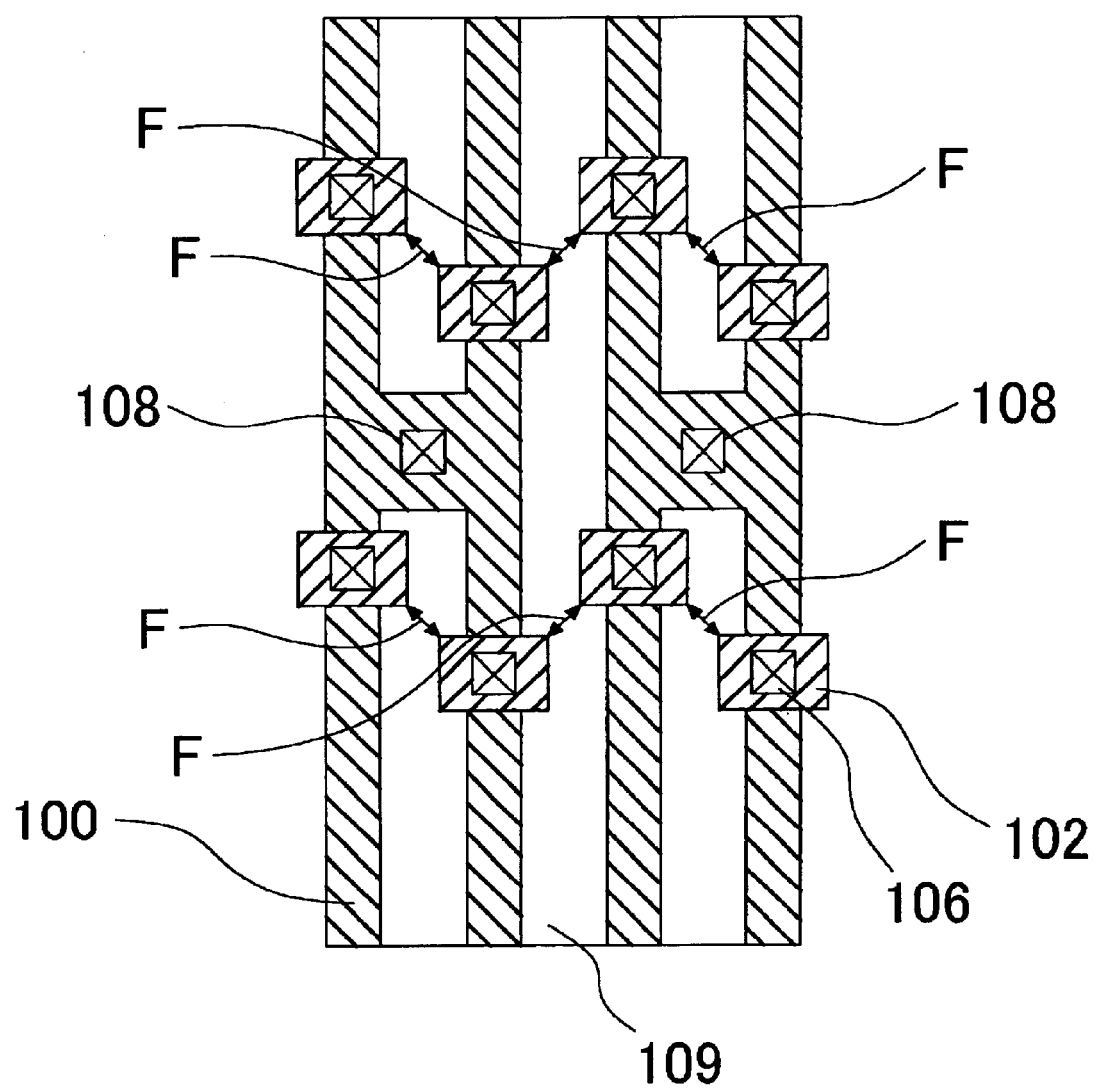
FIG. 6 is a view showing a layout for a minimum fabrication size between gates of adjacent selection transistors near H-shaped connection portion in FIG. 1.

FIG. 1 and FIG. 6 are layout showing a first embodiment of a nonvolatile semiconductor memory device according to the present invention. For easy understanding of the drawings, each of components is hatched and several components are omitted. FIG. 2 to FIG. 5 are cross sectional views for a portions along line A–A', line B–B', line C–C' and line D–D' shown in FIG. 1, respectively. In FIG. 3 corresponding to a B–B' cross section, a dog bone 107 for a first layer metal wiring M1 for a contact hole 108 is shown but it is omitted in the layout of FIG. 1 for avoiding the complexity of the drawing. Further, contact holes 108' for connecting the first layer metal wiring M1 and a second layer metal wiring M2 are shown in FIG. 3 but their pattern is identical with that of contact holes 108 for connecting a connection portion CNP of an active region 100 and the first layer wiring metal M1 above the connection portion CNP and they are also omitted in the layout of FIG. 1 so as to avoid the complexity of the drawing.

As shown in FIG. 1, on the active region 100, memory cell arrays each having a plurality of serial memory cells 101 are arranged in parallel by plural rows, to constitute a memory cell array MCA. A gate 102 of a selection transistor is disposed each by one on both ends of the memory cell rows, and gates of the selection transistors are separated on each of the active regions 100. Further, the gates of the selection transistors are disposed in two stages in the direction perpendicular to the global bit line 103 and the gate 102 of the selection transistor is disposed in each of the stages on every other active region. Further, the gates 102 of the selection transistors are connected by way of contact holes 106 with a gate wiring 107 (refer to FIG. 1, FIG. 4 and FIG. 5).

Figure 2:
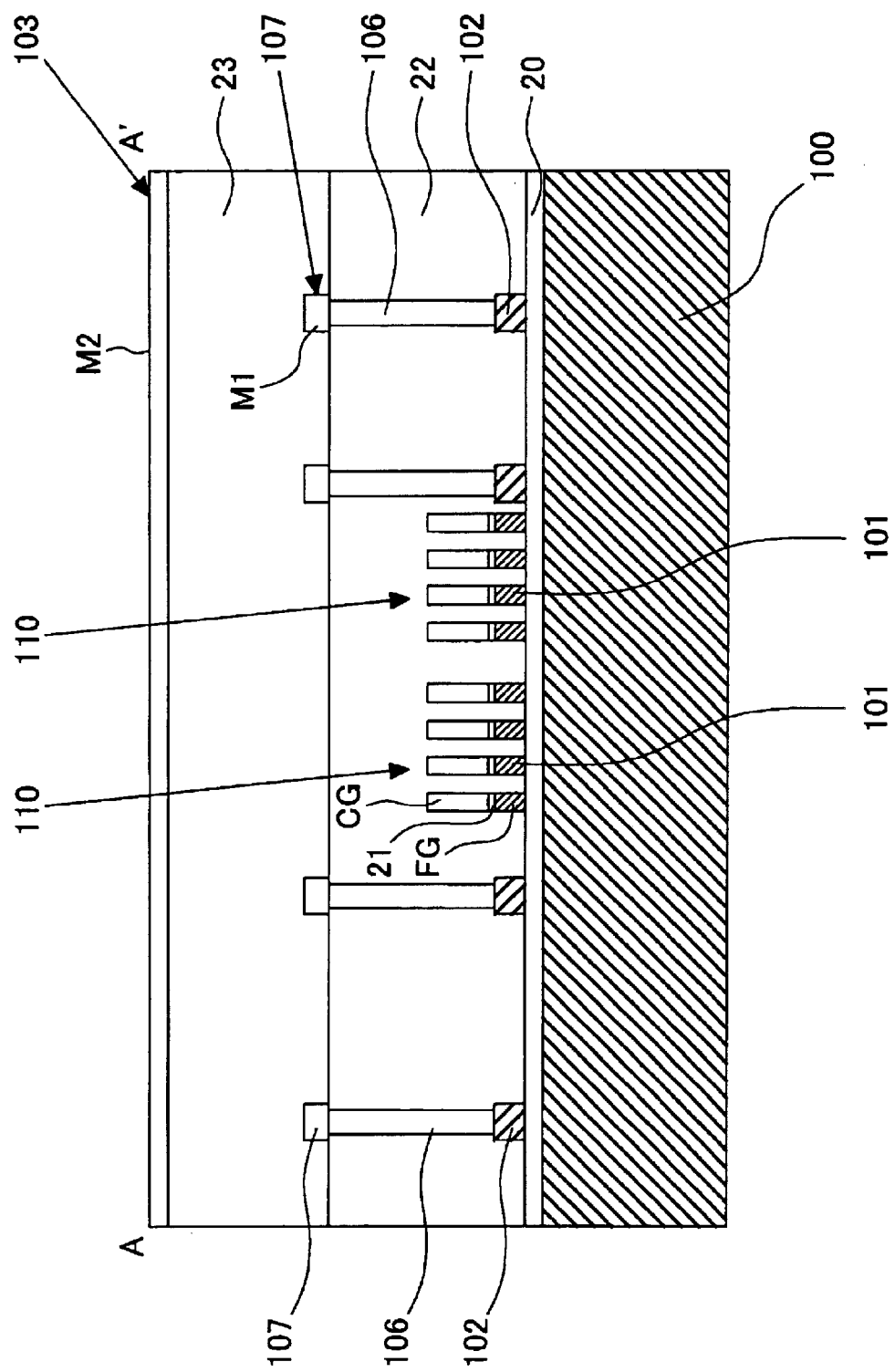
FIG. 2 is a cross sectional structural view for a portion along line A–A' shown in FIG. 1.
Figure 3:
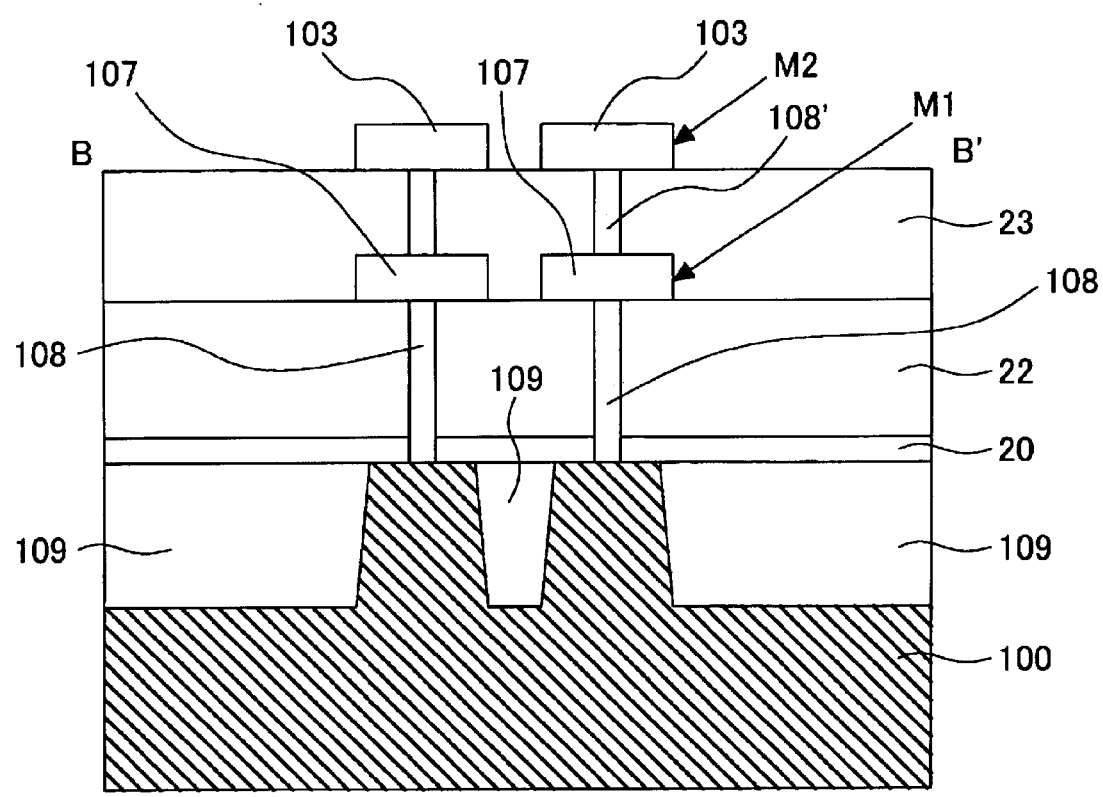
FIG. 3 is a cross sectional structural view for a portion along line B–B' shown in FIG. 1.
Figure 4:
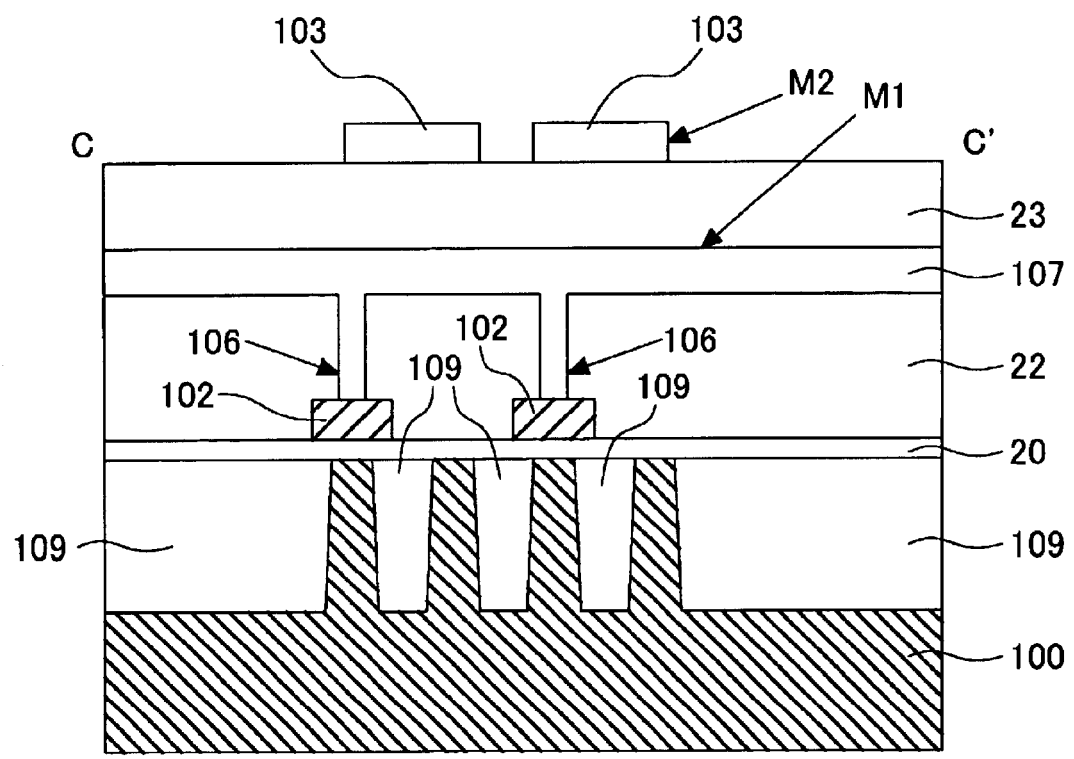
FIG. 4 is a cross sectional structural view for a portion along line C–C' shown in FIG. 1.
Figure 5:
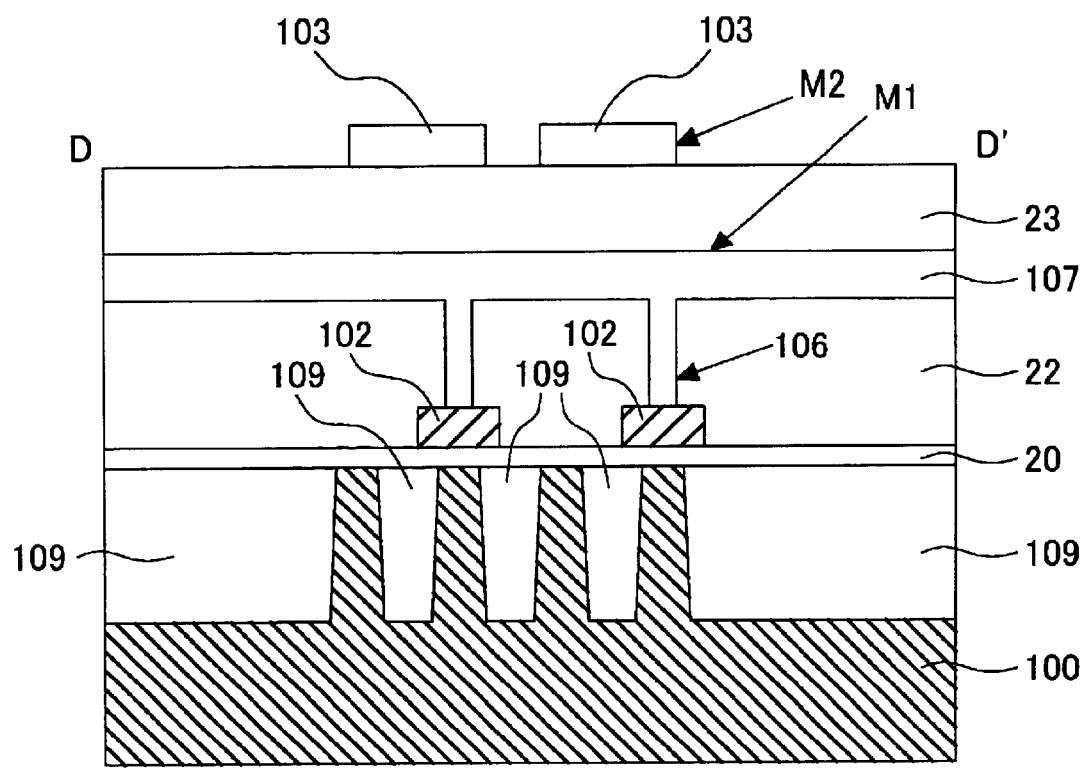
FIG. 5 is a cross sectional structural view for a portion along line D–D' shown in FIG. 1.

As shown in FIG. 2, each memory cell 101 comprises a floating gate FG (first gate) and a control gate CG (second gate). In FIG. 2, are shown an interlayer insulation film 20 between the active region 101 and the floating gate FG, and an interlayer insulation film 21 between the floating gate and the second gate. 22 and 23 also denote interlayer insulation films.

A first selection transistor portion 104 and a second selection transistor portion 105 are disposed in two stages in the direction perpendicular to the global bit line 103, and are disposed in mirror asymmetry with respect to the connection portion CNP of the active region 100 (asymmetrical with respect to the line B–B' for the first selection transistor portion). All of the active regions are connected between each of adjacent second selection transistor portions 105. On the other hand, adjacent two active regions are connected in an H-configuration between the first selection transistors 104 adjacent with each other to form the connection portion CNP. The contact hole 108 is formed at the H-shaped connection portion CNP and connected with the global bit line 103 (FIG. 1, FIG. 3). With this arrangement, the inter-gate distance of the selection transistors adjacent with each other as shown in FIG. 6 can be made as a minimum fabrication size F and the pitch of the selection transistors constituted in the two stages can be decreased. This decreases the area for the first and second selection transistor portions 104, 105 in the direction of the global bit line.

Figure 7:
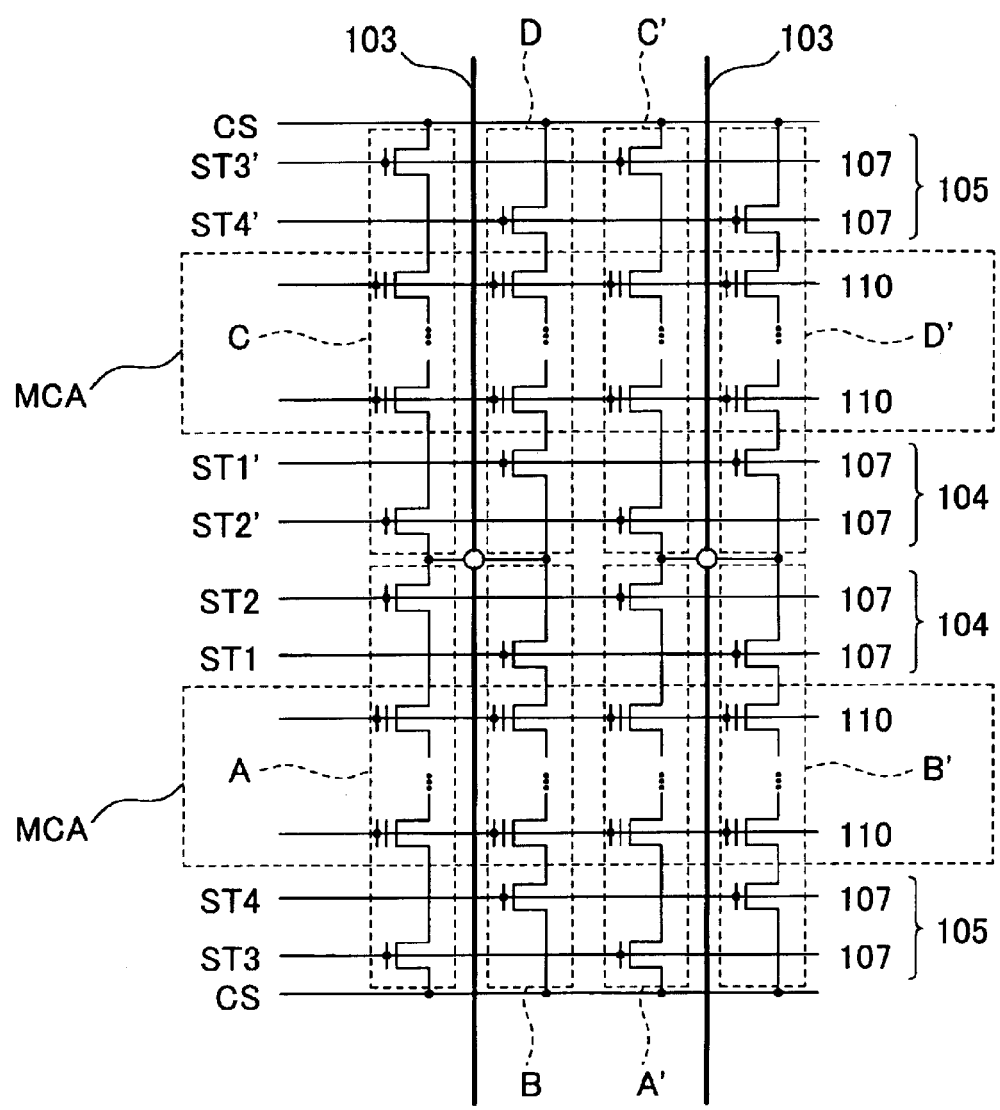
FIG. 7 is a circuit diagram for explaining an operation method of selection transistors in a first embodiment.

Then, an operation method of the selection transistors in this embodiment is to be described with reference to FIG. 7. Description is to be made to a case of operating the first selection transistor portion 104 and the second transistor portion 105 in the two stages to select the memory cell rows in the memory cell array MCA. In FIG. 7, CS is a source line.

First, the global bit line 103 is set high and wirings ST1, ST1', ST2' for selection transistors are set to 0 V to turn OFF the selection transistors connected to the wirings described above. When the wiring ST2 is set high and the selection transistors connected to the wiring are turned ON, row A and row A' are selected and the potential at the global bit line 103 is transferred to the row A and the row A'. In this step, other memory cell rows are disconnected from global bit line.

In the same manner, when the wirings ST1', ST2 and ST2' are set to 0 V and the wiring ST1 is set high to turn ON the selection transistors connected with the wirings, row B and row B' are selected.

Further, the wirings ST1, ST1', and ST2' for the selection transistors are set to 0 V to turn OFF the selection transistors connected with the wiring. When the wiring ST2' is set high to turn ON the selection transistors connected with the wirings, row C and row C' are selected and the potential on the global bit line 103 is transferred to the row C and the row C'.

Further, the wirings ST1, ST2, ST2' for the selection transistors are set to 0 V to turn OFF the selection transistors connected with the wirings. When the wiring ST1' is set high to turn ON the selection transistors connected with the wiring row D and row D' are selected and the potential on the global bit line 103 is transferred to the row D and the row D'.

Accordingly, in the memory cells on the adjacent two active regions connected in common, selection is established for the row A' when the row A is selected, for the row B' when the row B is selected, for the row C' when the row C is selected and for the row D' when the row D is selected.

This embodiment has an effect capable of decreasing the layout area for the selection transistor portion. Further, in the existent selection transistors in which enhancement type transistors and the depletion type transistors are disposed being properly connected serially in the direction of the global bit line, ion implantation is necessary for preparing the depletion type transistors. In this embodiment, however, since the depletion type transistor is no more required by separating the gate, the ion implantation is not necessary and manufacturing steps can be simplified.

Embodiment 2

Figure 8:
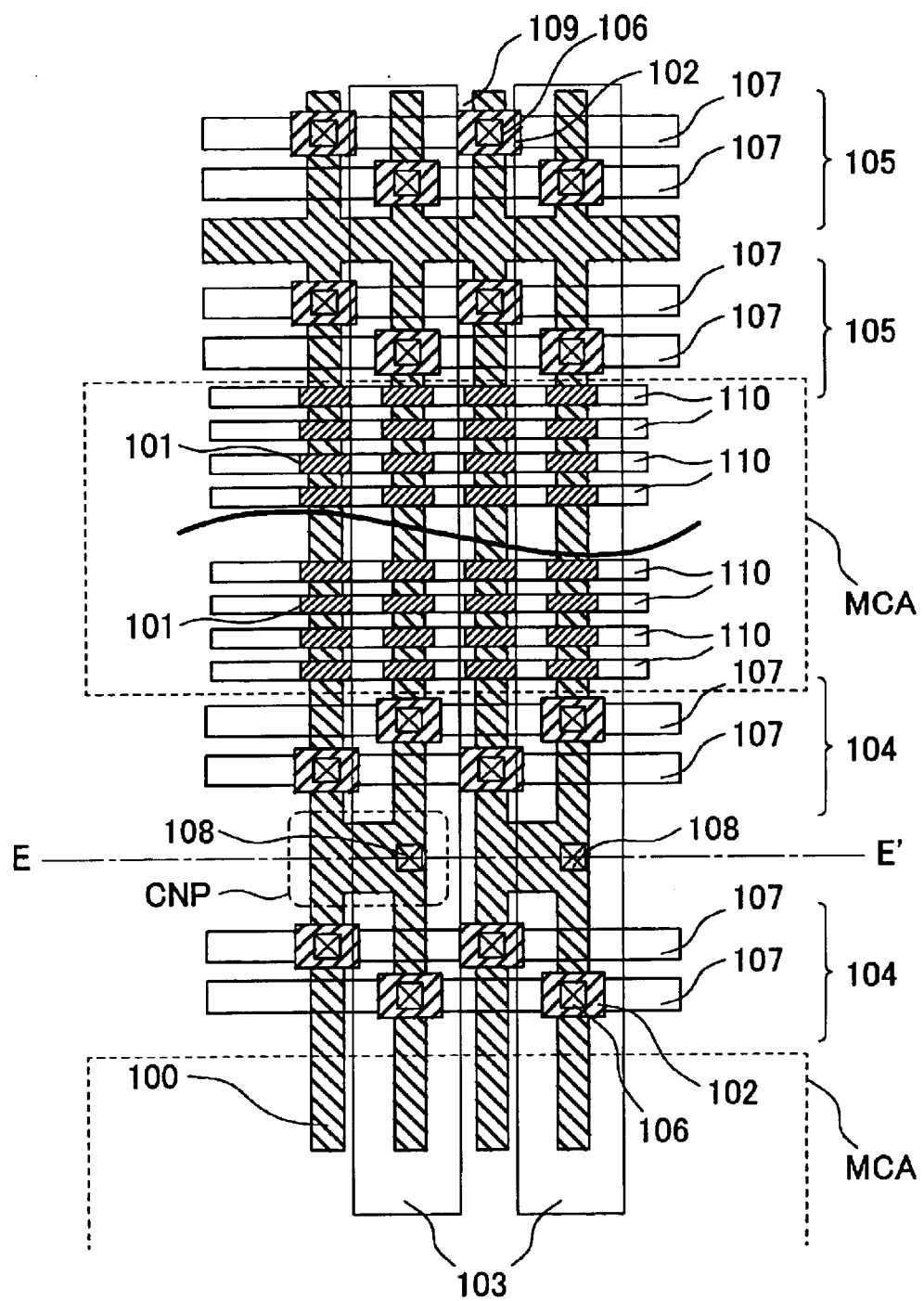
FIG. 8 is a plan view showing an example of a layout for a second embodiment of a nonvolatile semiconductor memory device according to the invention.

Then, Embodiment 2 of the nonvolatile semiconductor memory device according to the invention is to be described with reference to FIG. 8. The difference from Embodiment 1 is that the gates 102 of the selection transistors in the first selection transistor portion 104 is in the mirror symmetry with respect to the connection portion CNP for the active region 100 (that is, line-to-line symmetry with respect to line E–E'), and that the contact hole 108 is formed being displaced from the center for the active connection portion CNP to the intersection between the active region connection portion CNP and the active region 100. Other components, materials, structures are identical with those in Embodiment 1 described previously.

The structure of the existent selection transistor portion required selection transistors in four stages, alignment margin between the selection transistor and the contact hole and a space for disposing the contact hole. The advantageous feature of the selection transistor portion in this embodiment is that the layout space required for the selection transistors is only the space for disposing the selection transistor gates in four stages by displacing the contact hole 108 to the intersection between the active region connection portion CNP and the active region 100 and forming the same in the space between separated gates of the selection transistors, and the area for the selection transistor portion can be decreased further compared with the first embodiment.

The operation method of the selection transistors in this embodiment is identical with the operation method for the selection transistors in Embodiment 1.

Embodiment 3

Figure 9:
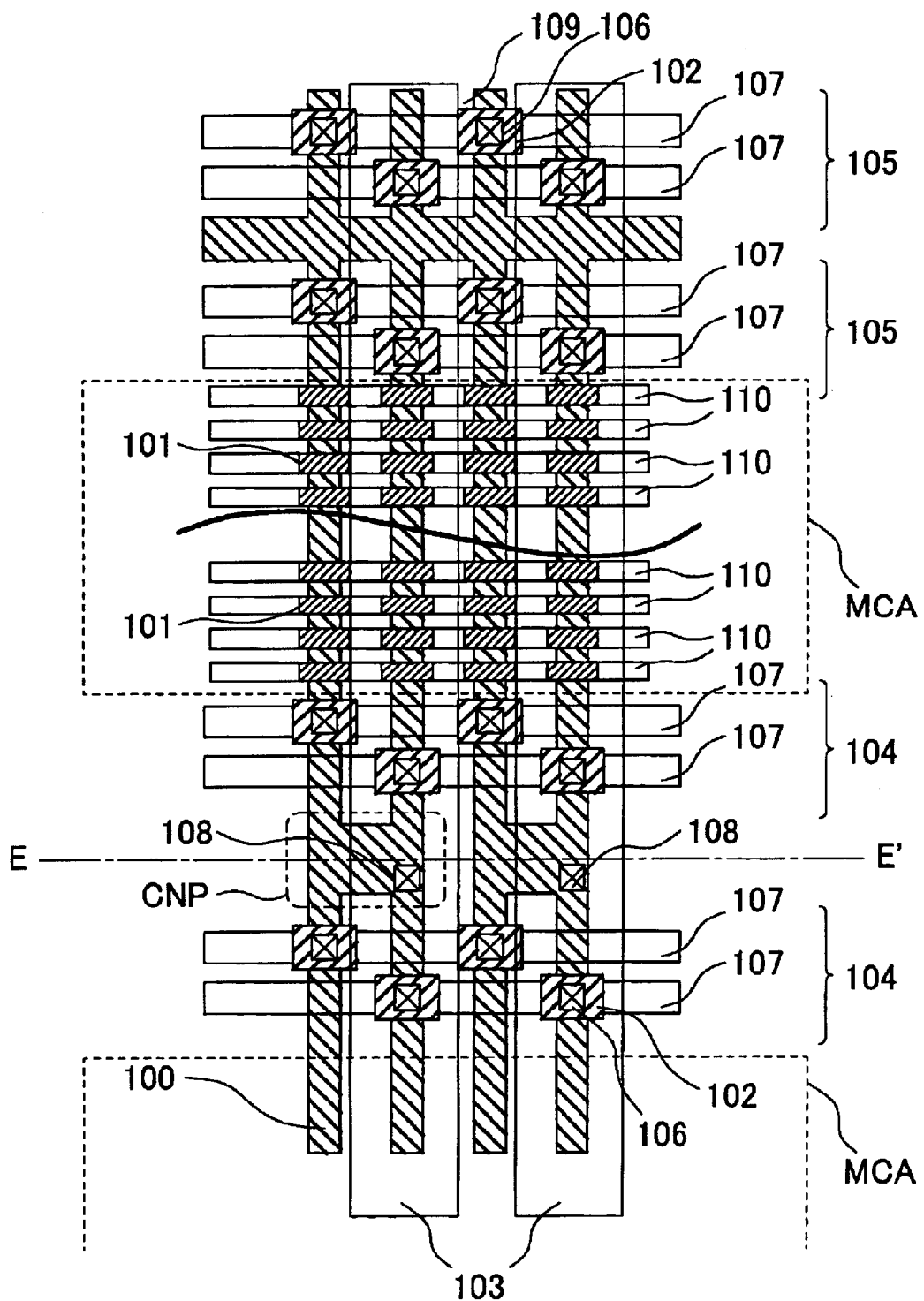
FIG. 9 is a plan view showing an example of a layout for a third embodiment of a nonvolatile semiconductor memory device according to the invention.

Then, Embodiment 3 of the nonvolatile semiconductor memory device according to the invention is to be described with reference to FIG. 9. This embodiment is different from Embodiment 2 in that the adjacent first selection transistor portions 104 are asymmetrical with respect to a plane perpendicular to the global bit line 103 and passing through the center of the connection portion CNP of the active region, and a contact hole 108 is formed at an intersection between the active connection portion CNP and the active region 100. Other components, materials and structures are identical with those in Embodiment 1.

Thus, the first selection transistor portion 104 can be laid out only with the selection transistor gates 102 in four stages and the area for the selection transistor portion can be decreased compared with Embodiment 1.

The operation method of the selection transistors in this embodiment is identical with the operation method for the selection transistors in Embodiment 1.

Embodiment 4

Figure 10:
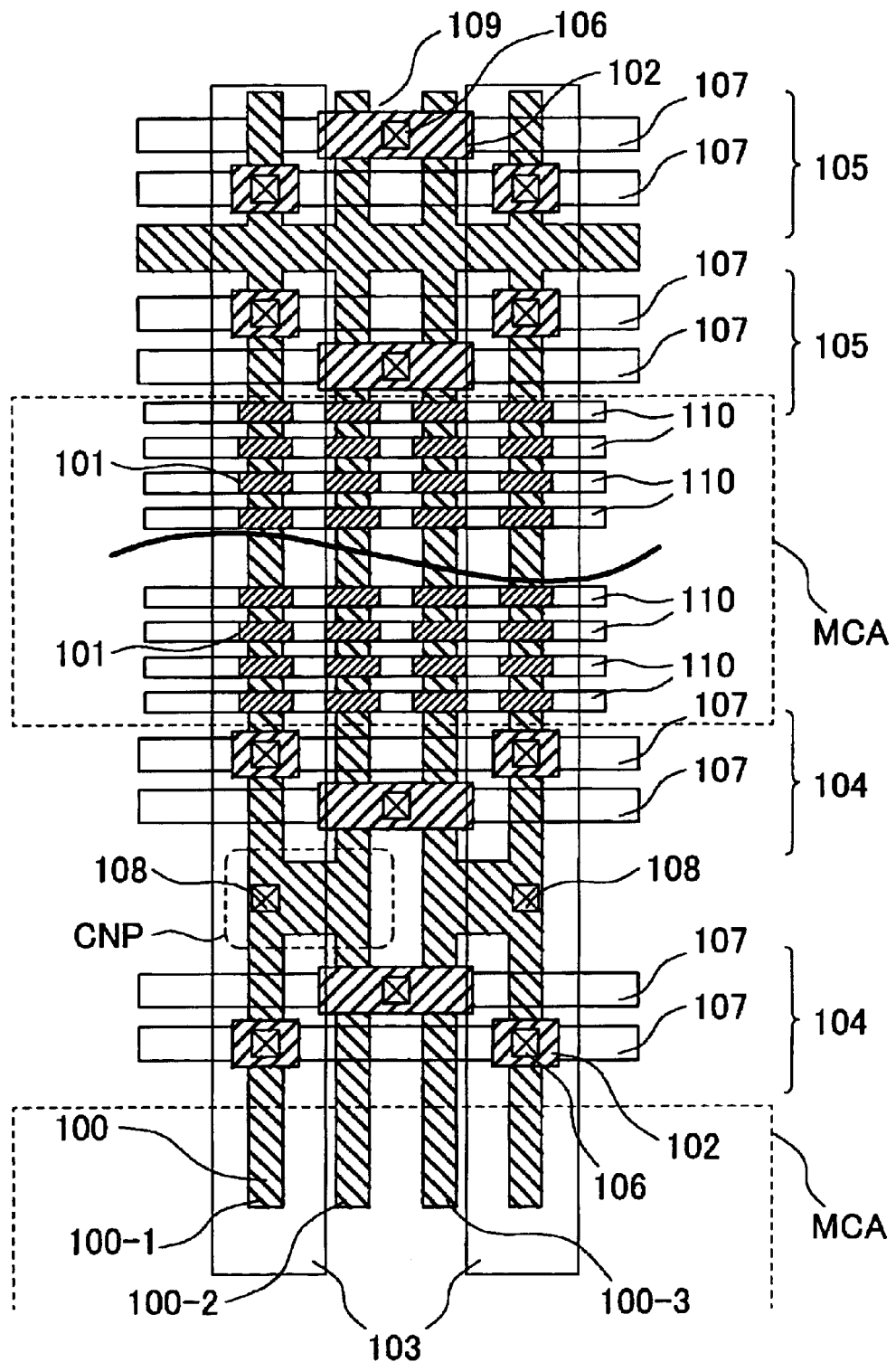
FIG. 10 is a plan view showing an example of a layout for a fourth embodiment of a nonvolatile semiconductor memory device according to the present invention.

Then, Embodiment 4 of the nonvolatile semiconductor memory device according to the invention is to be described with reference to FIG. 10.

This embodiment is different from Embodiment 2 in that gates 102 of the first selection transistor portion 104 are disposed so as to be in common with the two adjacent active regions 100. That is, the separated selection transistor gates are extended from one side of first and second active regions 100-1 and 100-2 to an adjacent third active region 100-3.

The advantageous feature of this embodiment, when compared with Embodiments 1 to 3, is that the number of contact holes 106 disposed to the gate electrode 107 of the first selection transistor portion 104 and the second selection transistor portion 105 can be decreased thereby enabling to moderate the pitch for the contact holes. Thus, it is possible to suppress lowering of yield caused by contact failure between the gate of the selection transistor and the contact hole. Further, like Embodiment 2, since the contact hole 108 for connecting the global bit line 103 and the active region 100, is disposed to the space between the separated gates of the selection transistors, the selected transistor portion can be laid out by four rows of selection transistor gates and the area for the selection transistor portion can be decreased compared with Embodiment 1.

Figure 11:
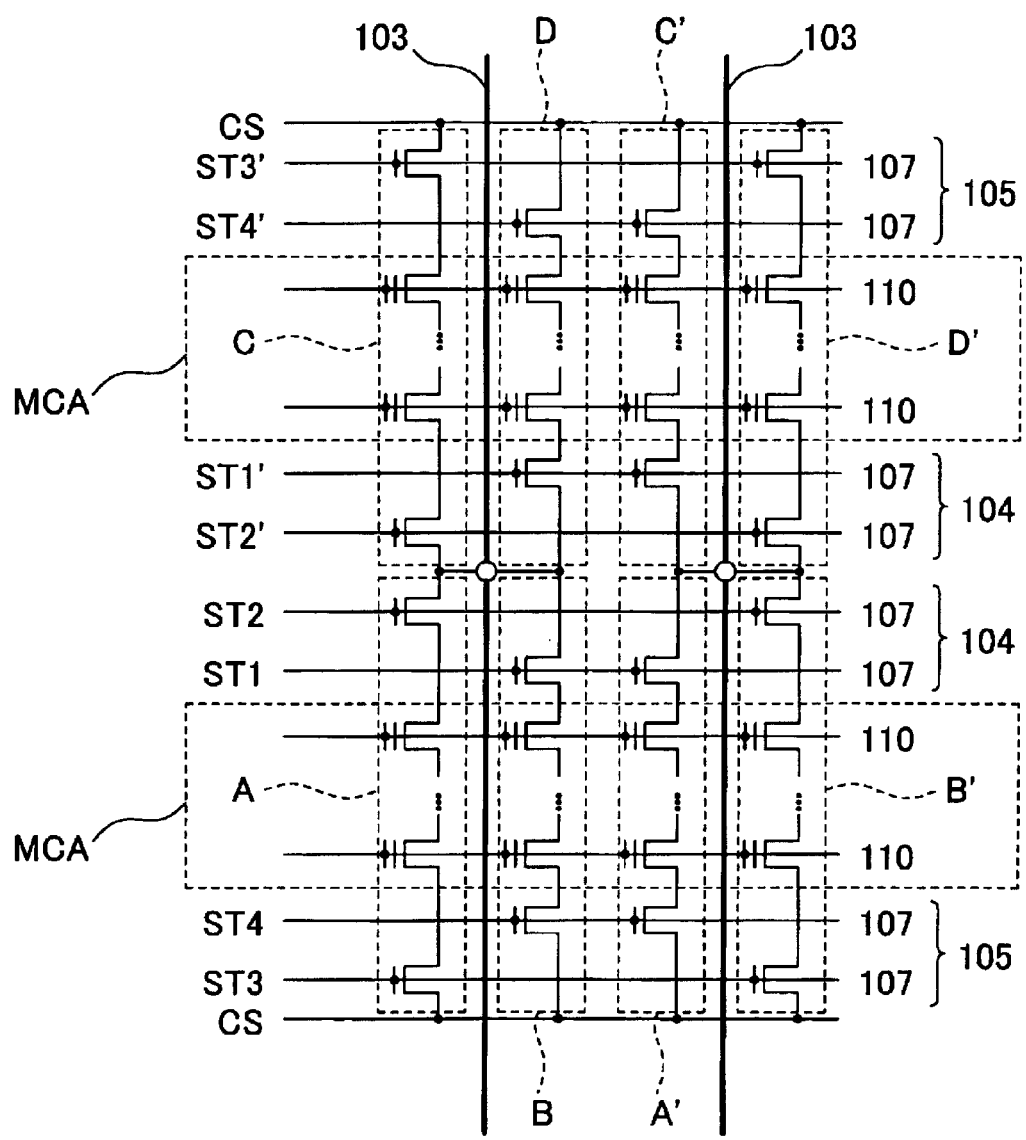
FIG. 11 is a circuit diagram for explaining an operation method of selection transistors in a fourth embodiment.

The operation method of the selection transistor in this embodiment is identical with that of Embodiment 1. As shown in FIG. 11, since the arrangement of the separated selection transistor gates 102 is different, selection is established for row B' when row A is selected, for row A' when row B is selected, for row D' when row C is selected, for row D' when row C is selected, and for row C' when row D is selected.

Embodiment 5

Figure 12:
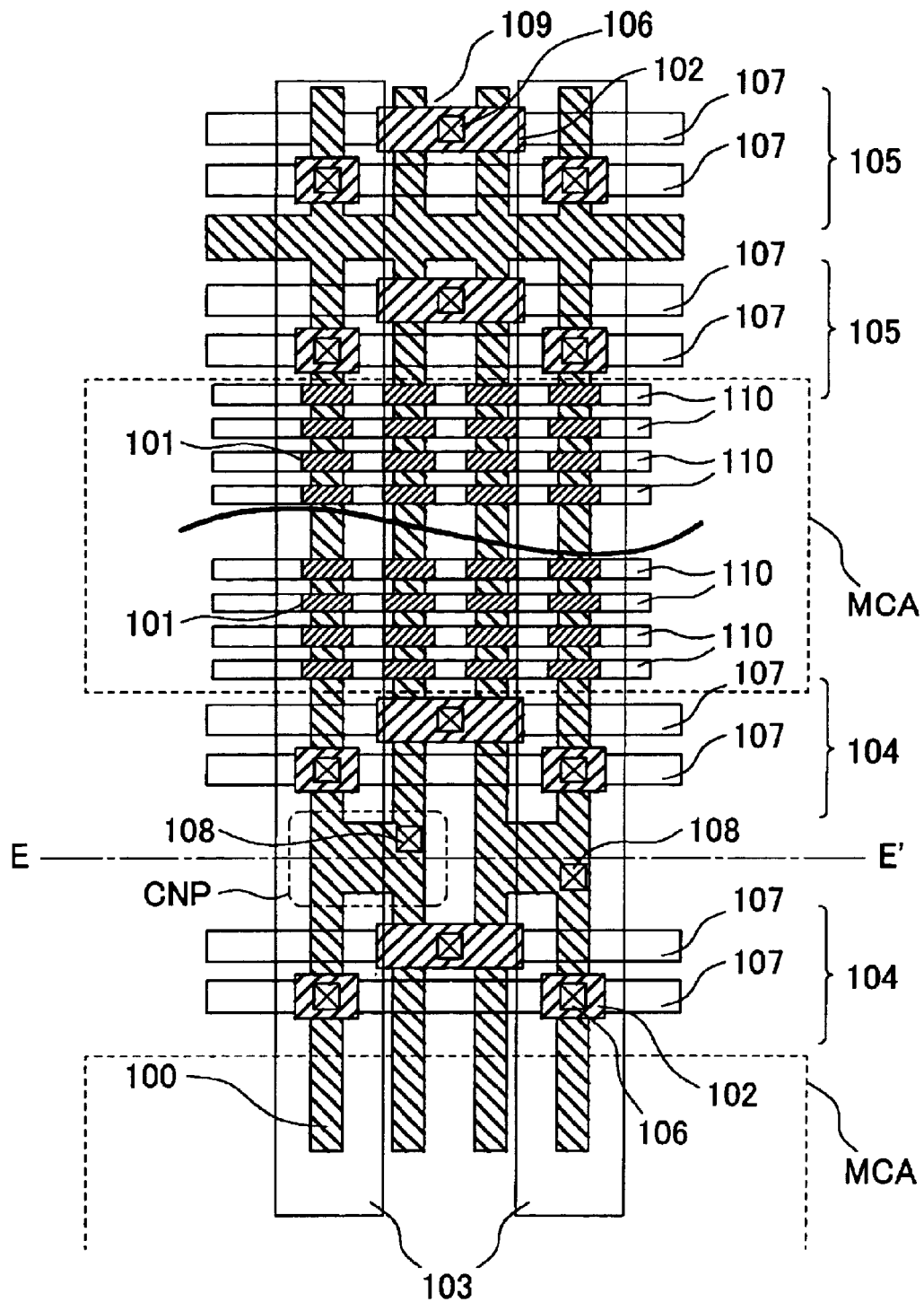
FIG. 12 is a plan view showing an example of a layout for a fifth embodiment of a nonvolatile semiconductor memory device according to the invention.

Then, Embodiment 5 of the nonvolatile semiconductor memory device according to the invention is to be described with reference to FIG. 12. This embodiment is different from Embodiment 4 in that contact holes 108 are disposed in mirror asymmetry with respect to the plane perpendicular to the global bit line 103 and passing the center of the active connection portion CNP. Other components, materials and structure are identical with those in Embodiment 4.

The advantageous feature of this embodiment, when compared with Embodiments 1 to 3 is that, like Embodiment 4, the number of contact holes 106 to the gate electrode 102 of the first selection transistor portion 104 and the second selection transistor portion 105 can be decreased to thereby moderate the pitch of the contact holes and suppress the lowering of the yield caused by contact failure between the gates of the selection transistors and the contact holes. In addition, like Embodiment 2, by disposing the contact hole 108 in the space between the gates of the separated selection transistors, portion can be laid-out by four rows of selection transistor gates. This can decrease the area for the first and second selection transistor portions 104 and 105 compared with Embodiment 1.

The operation method for the selection transistors in this embodiment is identical with the operation method for the selection transistors of Embodiment 4.

Embodiments 1 to 5 have been explained to an example of a so-called NAND type in which memory cells are connected in series, but the invention is applicable also to NOR type and AND type in which memory cells are connected in parallel to obtain similar effects.

Embodiment 6

Then, Embodiment 6 of the nonvolatile semiconductor memory device according to the invention is to be described. This embodiment is an example of applying the invention to a nonvolatile semiconductor memory device of a constitution, in a layout capable of decreasing the size in the direction of the global bit line, having a third gate of different function in addition to first and second gates, in which the gate of the selection transistor is not separated on the active region. The nonvolatile semiconductor memory device having the third gate described above is disclosed, for example, in Patent Document 3.

Figure 13:
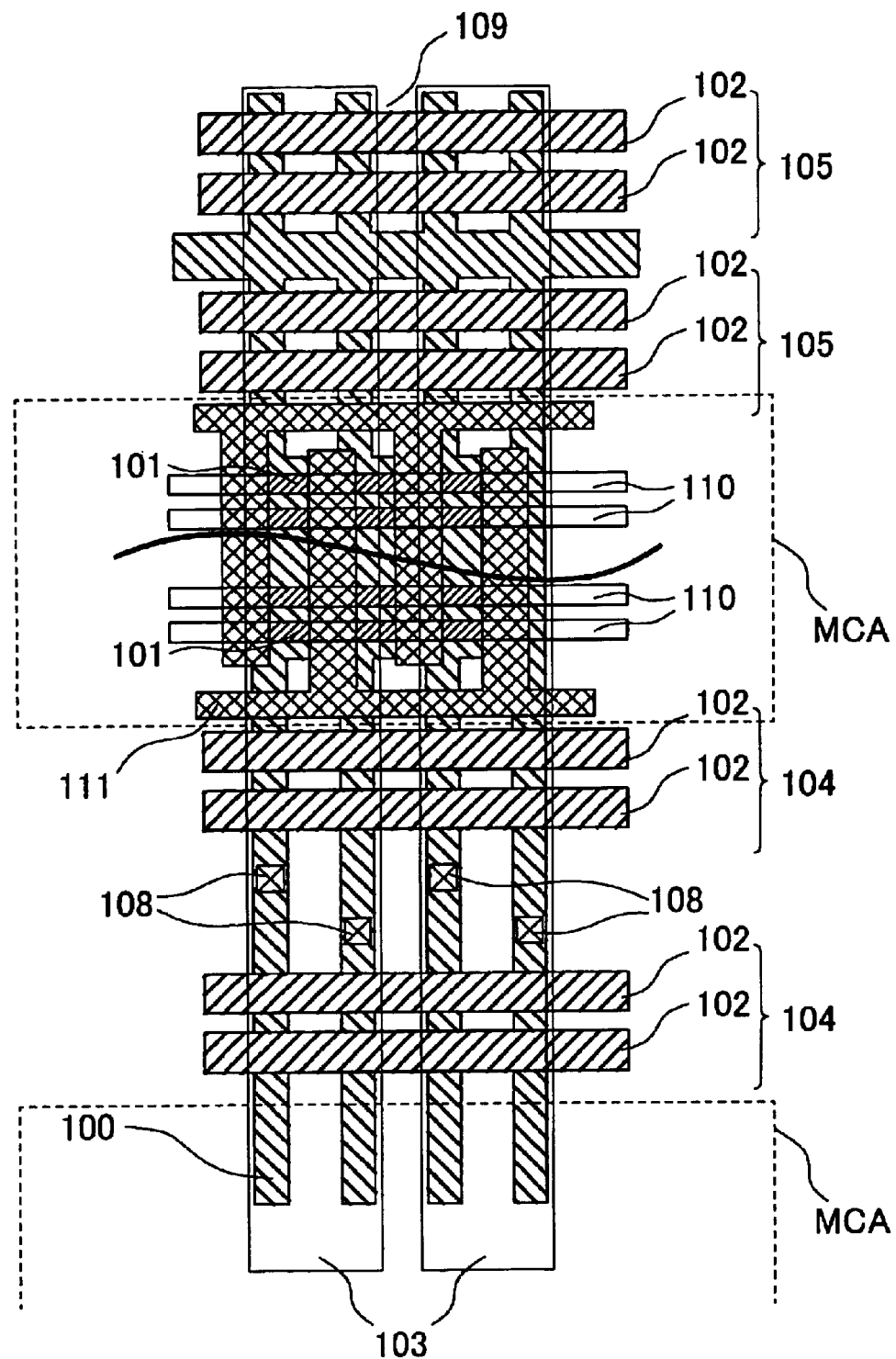
FIG. 13 is a plan view showing an example of a layout for a nonvolatile semiconductor device studied prior to the invention.

First, the layout previously studied by present inventors is shown in FIG. 13. In FIG. 13, a third gate 111 is formed on an active region 100 and a plurality of memory cells 101 are arranged in a space between the third gates. Gates 102 of selection transistors are arranged each by two on both ends of the memory cell 101. The gates 102 of the selection transistors are arranged in two stages perpendicular to the direction of the global bit line 103.

A first selection transistor portion 104 and a second selection transistor portion 105 comprise selection transistor gates 102, contact holes 106 for selection transistor gates and wirings 107 for the selection transistors. Since the gate of the selection transistor is not separated on the active region, the contact hole 106 for the selection transistor gate and the selection transistor wiring 107 may be connected at the ends, so that the contact hole 106 is formed by one at the end of the gates of the plurality of the selection transistors having the gate 102 in common and connected with the wiring 107, which was not illustrated in the range shown by FIG. 13. The selection transistors are constituted by connecting enhancement type transistors and depletion type transistors in series. The first selection transistor portion 104 and the second selection transistor portion 105 are arranged in two stages in the direction perpendicular to the global bit line 103. All the active regions 100 are connected between the adjacent second selection transistor portions 105.

The contact hole 108 is formed in each of the active regions of the first selection transistor portion 105 and connected with the global bit line 103. 109 denotes a device isolation region comprising a silicon oxide film (field oxide film) and 115 denotes a gate wiring for the memory cell.

In accordance with the arrangement shown in FIG. 13, in a nonvolatile memory cell where a third gate different in the function from the first gate (floating gate) and the second gate (control gate) is present being buried in the space between two first gates, two active regions 100 can be connected to a common global bit 103. In this layout, the size can be decreased in the direction of the global bit line by making the space between the adjacent contact holes 108 as minimum dimension.

Figure 14:
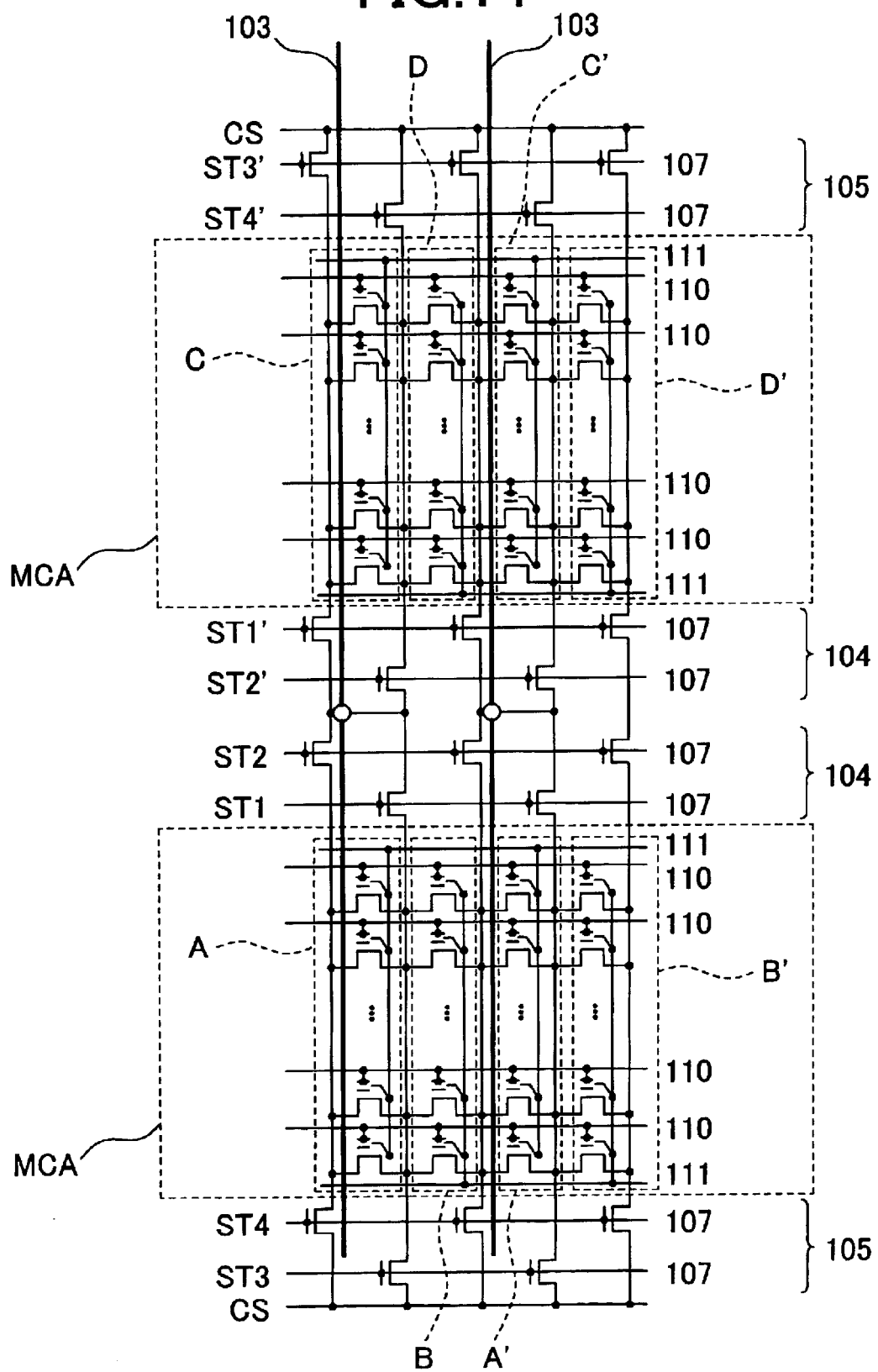
FIG. 14 is a circuit diagram for explaining an operation method of selection transistors in FIG. 13.

Then, an operation method of selection transistors in FIG. 13 is to be described with reference to FIG. 14.

In this case, it may suffice that memory cell rows A, B, C, and D can be selected respectively by operating the first selection transistor portion 104 and the second selection transistor 105 in two stages. However, in the memory cell where the third gate different in the function from the first gate and the second gate is present being buried in a space between two first gates, since the source and drain diffusion layer is a virtual ground type using adjacent memory cell and the diffusion layer in common, adjacent row A and row A' are operated as device isolation regions in a case of selecting, for example, a row B in FIG. 14, so that memory cell rows are selected on every other row.

First, regions surrounded with A–D, respectively, are noted. The global bit line 103 is set high. When wirings ST2', ST1', and ST1 are set to 0 V to turn OFF the selection transistors connected with the wirings, and wiring ST2 is set high to turn ON selection transistors connected with the wirings, only the row A is selected and the potential on the global bit line 103 is transferred to the row A. In this step, other bits are separated from the global bit line 103. In the same manner, row B is selected when the wiring ST3 is set high and other wirings are set to 0 V, row D is selected when the wiring ST2' is set high and other wirings are set to 0 V, and row C is selected when the wiring ST1' is set high and other wirings are set to 0 V.

On the other hand, when the wirings ST3' and ST4' are set to 0 V to turn OFF the selection transistor, and wiring ST3 is set to high to turn ON selection transistors, only the row B is selected and the potential on the source line is transferred to the row B. In this step, other memory cells are separated from the source line CS. In the same manner, row A is selected when the wiring ST4 is set high and other wirings are set to 0 V, row D is selected when wiring ST4' is set high and other wirings are set to 0 V, row C is selected when wiring ST3' is set high and other wirings are set to 0 V. Accordingly, in the memory cells where the two adjacent active regions are connected in common, row A' is selected when the row A is selected, row B' is selected when the row B is selected, row C' is selected when the row C is selected, and row D' is selected when the row D is selected.

Then, Embodiment 6 of the nonvolatile semiconductor memory device according to the invention is to be described with reference to FIG. 15. This embodiment is different from that of FIG. 13 studied previously in that an H-shaped connection portion CNP is disposed to adjacent active regions 100. Other components, materials, and structures are identical with those in FIG. 13.

Figure 15:
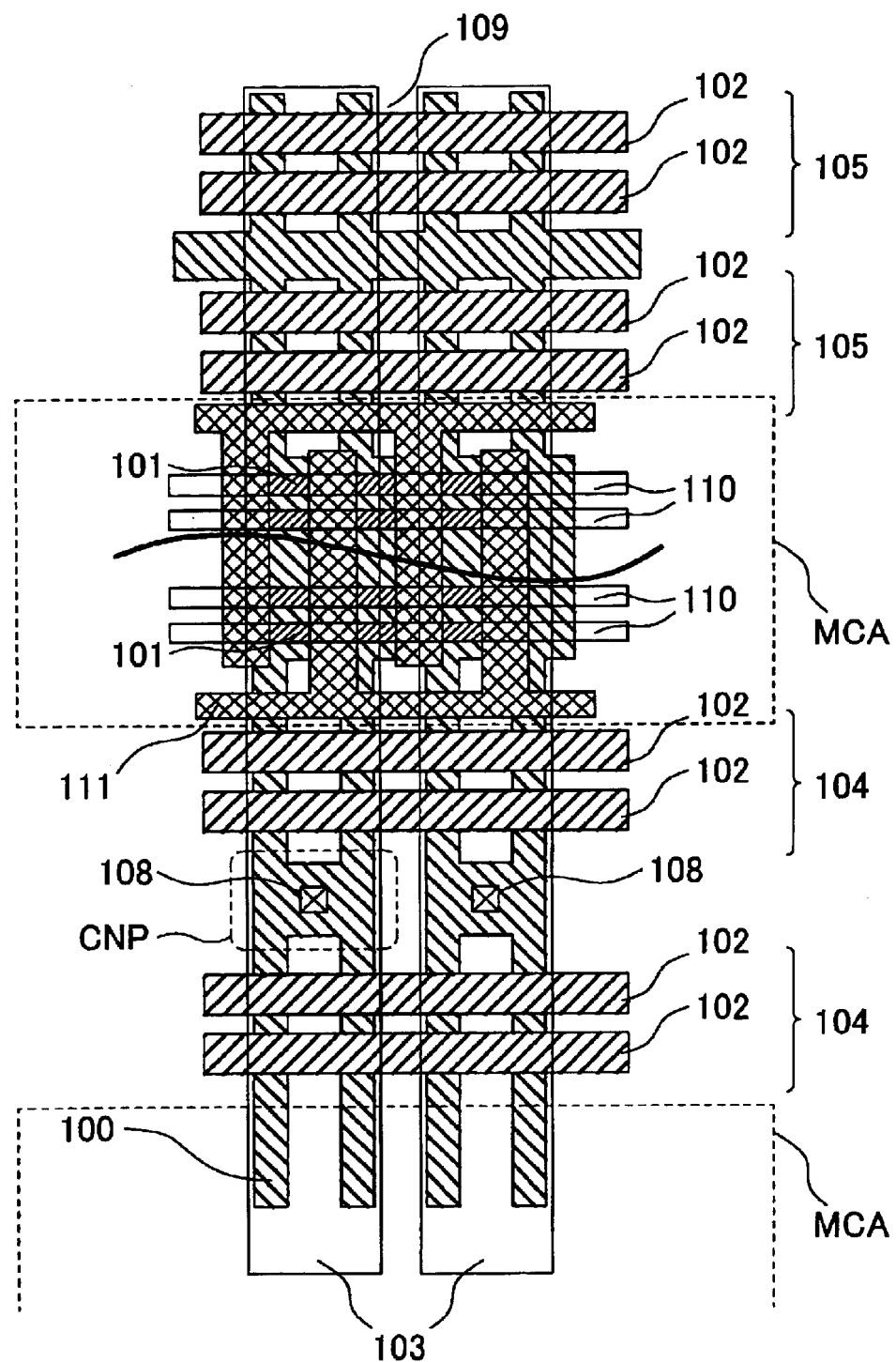
FIG. 15 is a plan view showing an example of a layout for a sixth embodiment of a nonvolatile semiconductor memory device according to the invention.

As shown in FIG. 15, in a nonvolatile memory cell where the third gate different in the function from the first gate and the second gate is present being buried in a space between two first gates, by connecting two active regions in common, the number of contact holes can be decreased. This enables to provide higher integration of the memory cell in the direction of the global line compared with FIG. 13.

The operation method of the selection transistor in this embodiment is identical with the operation method for the selection transistors in FIG. 13.

Embodiment 7

Figure 16:
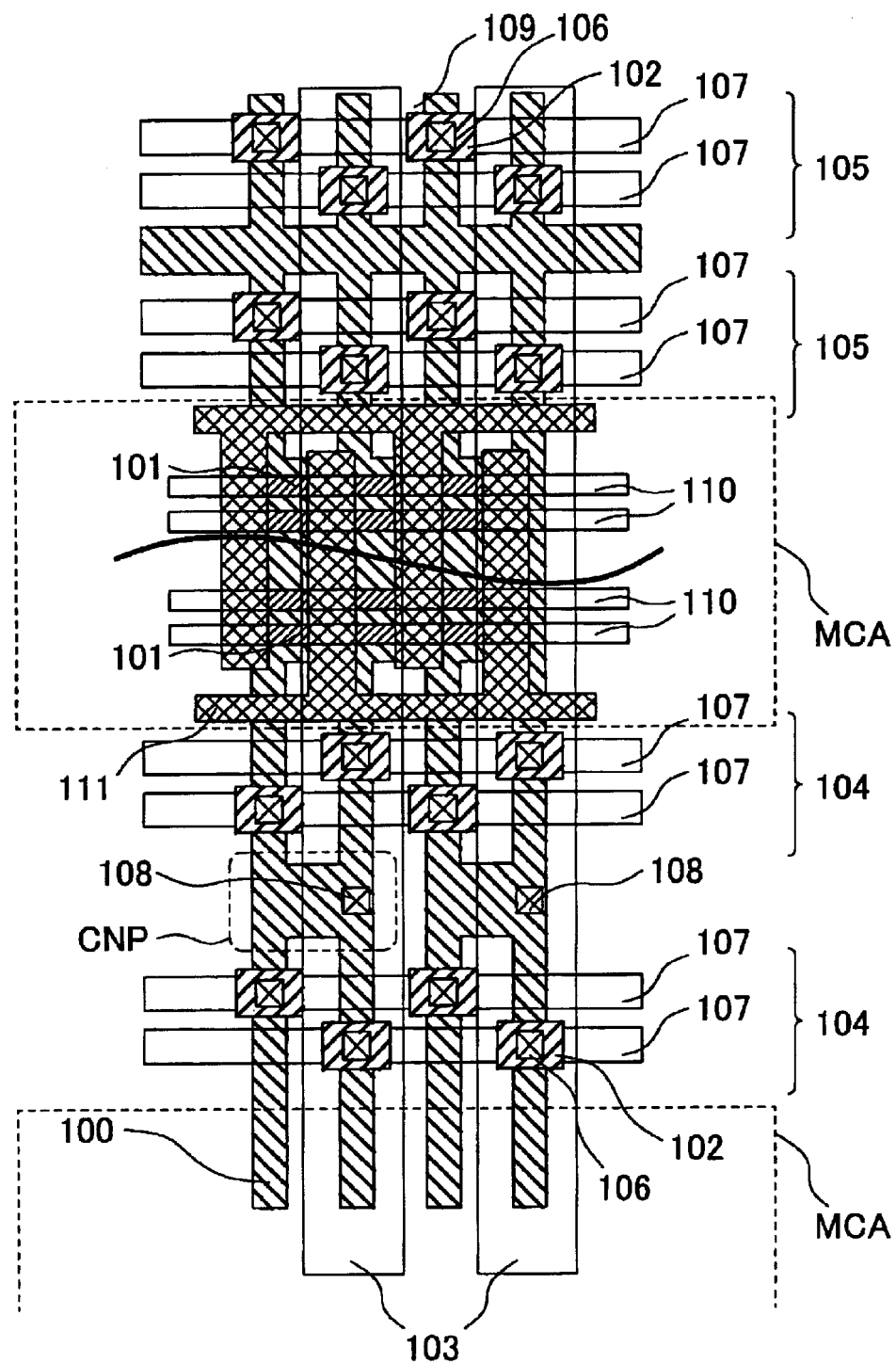
FIG. 16 is a plan view showing an example of a layout for a seventh embodiment of a nonvolatile semiconductor memory device according to the invention.

Then, Embodiment 7 of the nonvolatile semiconductor memory device according to the invention is to be described with reference to FIG. 16. This embodiment is different from Embodiment 6 in that the gate 102 for the selection transistor is separated and that the contact hole 108 is formed being displaced from the center of the connection portion CNP for the active region 100 to the intersection between the connection portion for the active region and the active region. Other components, materials, and structures are identical with those in Embodiment 6.

The advantageous feature of the selection transistor portion in accordance with the arrangement of this embodiment is that since the alignment margin with the respective gates between the adjacent selection transistors can be made as minimum dimension by disposing the selection transistor gates under separation, the layout area of the selection transistor portion in the direction of the global bit can be decreased.

In addition, by forming the contact hole 106 to a space between the separated selection transistor gates, the layout space required for the selection transistors is only the space for arranging the gates of selection transistors in four rows and the area for the selection transistor portion can be decreased when compared with Embodiment6.

The operation method for the selection transistors in this embodiment is identical with the operation method for the selection transistors in FIG. 13.

Embodiment 8

Figure 17:
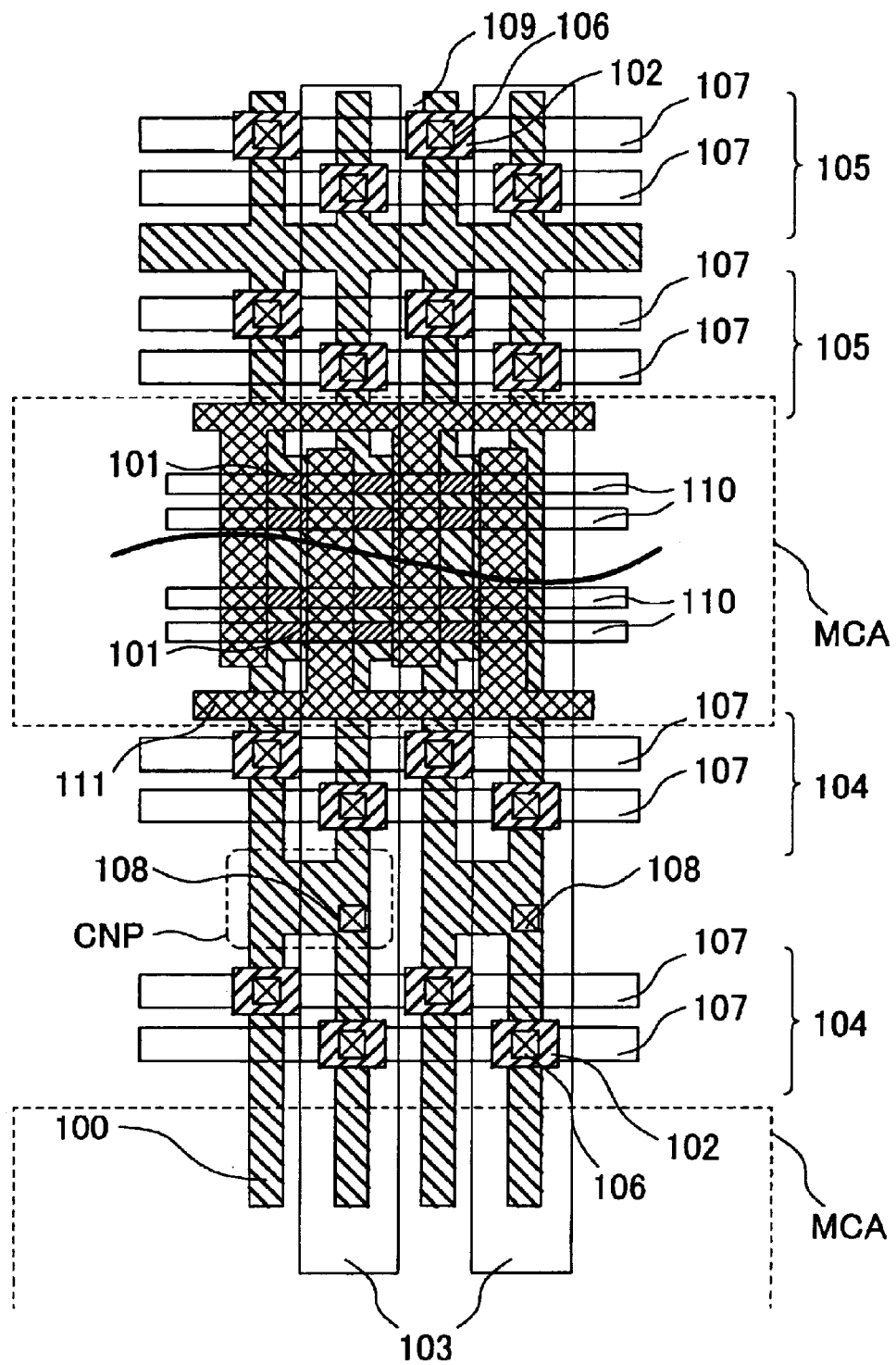
FIG. 17 is a plan view showing an example of a layout for an eighth embodiment of a nonvolatile semiconductor memory device according to the present invention.

Then, an Embodiment 8 of a nonvolatile semiconductor memory device according to the invention is to be described with reference to FIG. 17. This embodiment is different from Embodiment 7 only for the arrangement of gates 102 of the first selection transistor portion 104, and other components, materials, and structures are identical with those in Embodiment 7.

In the arrangement of this embodiment, since the gate wiring 107 for the selection transistors and the contact holes 106 for the gate electrode for selection transistors are formed being displaced to the memory cell, the selection transistor portions 104 and 105 can be laid out only for the space of disposing the gates of the selection transistors in four rows like in Embodiment 7, and the area for the selection transistor portion can be decreased compared with the case of FIG. 13.

While description has been made for preferred embodiments of the invention, it will be apparent that the invention is not restricted to the embodiments described above but design thereof may be changed variously within the range not departing the gist of the invention.

As apparent from the embodiments described above, according to the nonvolatile semiconductor memory device of the present invention, the pitch for the selection transistors constituted in two stages can be decreased. This can decrease the area for the selection transistor portion in the direction of the global bit line to decrease the chip area.

What is claimed is:

1. A nonvolatile semiconductor memory device comprising:
   a memory cell array in which plural nonvolatile memory cells are arranged in matrix,
   a connection portion for an active region that partially connects first and second active regions adjacent with each other with a device isolation region put therebetween in a first direction in which control gates extend in the memory cell array,
   a contact hole for connecting a global bit line to the connection portion,
   a first selection transistor for selecting the first active region disposed between the contact hole and the memory cell array, and
   a second selection transistor for selecting the second active region disposed between the contact hole and the memory cell array.

2. A nonvolatile semiconductor memory device according to claim 1, wherein gates of the first and second selection transistors for selecting the first and second active regions are separated, and the gate of the first transistor and the gate of the second transistor are disposed without overlap thereof along the first direction.

3. A nonvolatile semiconductor memory device according to claim 2, wherein the separated gates of the first and second selection transistors are arranged in two stages in the direction of the global bit line.

4. A nonvolatile semiconductor memory device according to claim 3, wherein the gates for the selection transistor in each stage are disposed on every other active region.

5. A nonvolatile semiconductor memory device according to claim 2, wherein the contact hole is formed about at an intersection between one of the first and second active regions and the connection portion, and one of the gates of the first and second selection transistors that is disposed on the side of the memory cell is disposed on the active region in which the contact hole is formed.

6. A nonvolatile semiconductor memory device according to claim 5, wherein the gate for the first and second selection transistors is separated and disposed being further extended from the first active region to the third active region adjacent with the second active region.

7. A nonvolatile semiconductor memory device according to claim 2, wherein the gates of the selection transistors and the memory blocks constituting the memory cell array are disposed in mirror symmetry with respect to a plane perpendicular to the global bit line and passing through the connection portion for the active regions.

8. A nonvolatile semiconductor memory device according to claim 2, wherein the memory blocks constituting the memory cell array are disposed in mirror symmetry with respect to a plane perpendicular to the global bit line and passing through the connection portion for the active regions, while the gates of the selection transistors are disposed in mirror asymmetry with respect to the plane perpendicular to the global bit line and passing through the connection portion for the active regions.

9. A nonvolatile semiconductor memory device according to claim 2, wherein the memory cells are connected in series with the direction of the global bit line.

10. A nonvolatile semiconductor memory device according to claim 2, wherein the memory cells are connected in parallel with the direction of the global bit line.

11. A nonvolatile semiconductor memory device according to claim 2, wherein the nonvolatile memory cell has a first gate, a second gate, and a third gate different in the function from the first gate and the second gate.

12. A nonvolatile semiconductor memory device comprising a memory cell array constituted by arranging, in a matrix, nonvolatile memory cells each having a first gate, a second gate, and a third gate different in the function from the first gate and the second gate, in which two active regions adjacent to each other with the device isolation region put therebetween in a first direction in which control gates extend are combined in one set, and respective active regions are connected by way of contact holes to a global bit line in common, and having first and second selection transistors for selecting the active regions.

13. A nonvolatile semiconductor memory device according to claim 12, wherein the gate of the first selection transistor and the gate of the second selection transistor are disposed without overlap thereof along the first direction.

14. A nonvolatile semiconductor memory device according to claim 2, wherein the distance in a second direction across the first direction between the gate of the first selection transistor and the gate of the second selection transistor is within a minimum fabrication size.

15. A nonvolatile semiconductor memory device according to claim 13, wherein the distance in a second direction across the first direction between the gate of the first selection transistor and the gate of the second selection transistor is within a minimum fabrication size.

16. A nonvolatile semiconductor memory device comprising:
   a memory cell array having a control gate extending in a first direction in a memory cell region,
   a first active region and as second active region adjacent in the first direction, formed in a selection transistor region and extending up to the memory cell region, a connection region to connect a part of the first active region and a part of the second active region, a first selection transistor for selecting any memory cell disposed on the first active region, and a second selection transistor for selecting any memory cell disposed on the second active region, and wherein a gate of the first selection transistor and a gate of the second selection transistor are disposed without overlap thereof along the first direction and a second direction perpendicular to the first direction.

17. A nonvolatile semiconductor memory device according to claim 16, wherein the distance in the second direction between the gate of the first selection transistor and the gate of the second selection transistor is within a minimum fabrication size.

* * * * *